US008070893B2

(12) United States Patent
Era et al.

(10) Patent No.: US 8,070,893 B2
(45) Date of Patent: *Dec. 6, 2011

(54) CU—NI—SI—CO—CR COPPER ALLOY FOR ELECTRONIC MATERIALS AND METHOD FOR MANUFACTURING SAME

(75) Inventors: Naohiko Era, Ibaraki (JP); Kazuhiko Fukamachi, Ibaraki (JP); Hiroshi Kuwagaki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 832 days.

This patent is subject to a terminal disclaimer.

(21) Appl. No.: 11/887,660

(22) PCT Filed: Mar. 31, 2006

(86) PCT No.: PCT/JP2006/306876
§ 371 (c)(1),
(2), (4) Date: Sep. 28, 2007

(87) PCT Pub. No.: WO2006/106939
PCT Pub. Date: Oct. 12, 2006

(65) Prior Publication Data
US 2009/0025840 A1 Jan. 29, 2009

(30) Foreign Application Priority Data
Mar. 31, 2005 (JP) ................. 2005-104474

(51) Int. Cl.
*C22C 9/06* (2006.01)
*C22F 1/08* (2006.01)
(52) U.S. Cl. ........ 148/435; 148/414; 148/681; 148/682; 420/485; 420/486; 420/487; 420/488
(58) Field of Classification Search .............. 148/435, 148/414, 681, 682; 420/485–488
See application file for complete search history.

(56) References Cited

U.S. PATENT DOCUMENTS

| 4,594,221 A | 6/1986 | Caron et al. | 420/485 |
| 5,021,105 A * | 6/1991 | Asai et al. | 148/433 |
| 2002/0029827 A1 | 3/2002 | Liu et al. | 148/554 |
| 2005/0028907 A1 | 2/2005 | Hasegawa et al. | 148/683 |

FOREIGN PATENT DOCUMENTS

| JP | 3271351 | | 12/1991 |
| JP | 04180531 | * | 6/1992 |
| JP | 3049137 B2 | | 3/2000 |
| JP | 2001-207229 | | 7/2001 |
| JP | 3510469 | | 1/2004 |
| JP | 3510469 B2 | | 1/2004 |
| JP | 2004149874 | * | 5/2004 |
| JP | 2005 048262 | | 2/2005 |
| PL | 119836 | * | 1/1982 |
| WO | WO 03/076672 A1 | | 9/2003 |
| WO | WO 2004/005560 A2 | | 1/2004 |

OTHER PUBLICATIONS

Chem Abstract 145:402149, abstracting JP2006283059 (Oct. 19, 2006).
Chem Abstract 141:414240, abstracting JP2004315940 (Nov. 11, 2004).
Chem Abstract 135:64906, abstracting JP2001181759 (Jul. 3, 2001).

* cited by examiner

*Primary Examiner* — Sikyin Ip
(74) *Attorney, Agent, or Firm* — Drinker Biddle & Reath LLP

(57) ABSTRACT

The invention provides Cu—Ni—Si—Co—Cr copper alloys for electronic materials having excellent characteristics such as dramatically improved strength and electrical conductivity. In one aspect, the invention is a Cu—Ni—Si—Co—Cr copper alloy for electronic materials, containing about 0.5-about 2.5% by weight of Ni, about 0.5 -about 2.5% by weight of Co, about 0.30-about 1.2% by weight of Si, and about 0.09 -about 0.5% by weight of Cr, and the balance being Cu and unavoidable impurities, wherein the ratio of the total weight of Ni and Co to the weight of Si in the alloy composition satisfies the formula: about $4 \leq [Ni+Co]/Si \leq$ about 5, and the ratio of Ni to Co in the alloy composition satisfies the formula: about $0.5 \leq Ni/Co \leq$ about 2, and wherein Pc is equal to or less than about $15/1000 \, \mu m^2$, or Pc/P is equal to or less than about 0.3 wherein P is the number of inclusions dispersed in the alloy and having the size of 1 μm or more, and Pc is the number of inclusions, among those having the size of 1 μm or more, whose carbon concentration is 10% or more by weight.

4 Claims, No Drawings

CU—NI—SI—CO—CR COPPER ALLOY FOR ELECTRONIC MATERIALS AND METHOD FOR MANUFACTURING SAME

FIELD OF THE INVENTION

The present invention relates to precipitation hardening copper alloys, in particular, to Cu—Ni—Si—Co—Cr copper alloys suitable for use in a variety of electronic components.

BACKGROUND OF THE INVENTION

A copper alloy used in electronic components such as a lead frame, connector, pin, terminal, relay and switch is required to satisfy both high-strength and high-electrical conductivity (or thermal conductivity) as a basic characteristic. In recent years, as high-integration and reduction in size and thickness of an electronic component have been rapidly advancing, requirements for copper alloys used in these electronic components have been sophisticated more than ever.

However, the characteristics of copper alloys as well as other alloys are affected by composition elements and structures, and condition of heat-treatment. In addition, the predictability of the effect caused by a subtle change in composition elements or condition of heat-treatment on the characteristics of the alloys is generally very low. Therefore, it has been very difficult to develop a novel copper alloy satisfying the continuously increasing requirements.

In recent years, with consideration to high-strength and high-electrical conductivity, the usage of age hardening copper alloys in electronic components has been increasing, replacing traditional solid-solution hardening copper alloys as typified by phosphor bronze and brass. In the age hardening copper alloys, the age hardening of supersaturated solid solution, which underwent solution treatment beforehand, disperses fine precipitates uniformly, thereby increasing the strength of the alloys. At the same time, it also reduces the amount of solved elements contained in the copper, thereby increasing the electrical conductivity. For this reason, it provides materials having excellent mechanical characteristics such as strength and stiffness, as well as high electrical and thermal conductivity.

Among age hardening copper alloys, Cu—Ni—Si copper alloys are typical copper alloys having relatively high electrical conductivity, strength, good stress relaxation characteristic and bending workability, and therefore they are among the alloys that have been actively developed in the industry in these days. In these copper alloys, fine particles of Ni—Si intermetallic compounds are precipitated in copper matrix, thereby increasing strength and electrical conductivity.

In general, the precipitation of Ni—Si intermetallic compounds, which contributes to strengthening, is composed of stoichiometric composition. For example, Japanese patent laid-open publication No. 2001-207229 discloses a way of achieving good electrical conductivity by bringing the mass ratio of Ni and Si in an alloy close to the concentration of the intermetallic compound, $Ni_2Si$, namely, by adjusting the mass ratio of Ni and Si such that the ratio Ni/Si becomes from 3 to 7.

Further, Japanese patent publication No. 3510469 states that, similar to Ni, Co forms a compound with Si, thereby increasing strength, and Cu—Co—Si alloys, when age-hardening, have slightly better strength and electrical conductivity than Cu—Ni—Si alloys. Further, it also states that, where acceptable in cost, Cu—Co—Si and Cu—Ni—Co—Si alloys may be also selectable, Further, Japanese patent publication No. 2572042 mentions Co as an example of a silicide forming elements and impurities which give no adverse effect on properties of copper alloys. It also states that such element, if existed in the alloy, should be contained by replacing the equivalent amount of Ni, and may be contained in the effective amount equal to or less than about 1%.

Further, Japanese patent publication No. 3049137 states that the addition of Co is effective in the structure control of Ni—Si copper alloy manufacture, in which the amount of S and other manufacturing conditions are controlled. It also states that a very small amount of Cr addition is effective in the improvement of hot workability, and the amount of Cr should be no larger than 0.1% by weight.

However, since Co is more expensive than Ni as stated in the aforementioned document, and thereby has the drawback in practical use. Therefore, no or few meticulous studies have been conducted on Cu—Ni—Si alloys using Co as an additive element in the past. In addition, it has been believed that, similar to Ni, Co forms compounds with Si, and slightly increases mechanical strength and electrical conductivity by replacing Ni. However, it has never been conceived that Co dramatically improves characteristics of alloys. In addition, it have been strongly believed that the addition of Cr contributes to strengthening only when it is precipitated by itself, and it has not been recognized as an element which dramatically improves electrical conductivity without adversely affecting strength.

Problems to be Solved by the Invention

The object of the invention is to provide Cu—Ni—Si—Co—Cr copper alloys for electronic materials having excellent characteristics.

Means for Solving the Problem

The inventors have diligently studied to cope with the requirements for copper alloys used for increasingly sophisticated electronic materials, and eventually have focused on Cu—Ni—Si alloys containing Co and Cr. Then, after further examinations on Cu—Ni—Si alloys containing Co and Cr, we have also found out that the characteristics (especially strength and electrical conductivity) of Cu—Ni—Si alloys containing Co and Cr improve more dramatically than expected from the explanation of prior art when size, composition and distribution of inclusions are controlled under the certain condition of composition and manufacturing process.

The present invention has been made based on these findings. In one aspect, the invention is (1) a Cu—Ni—Si—Co—Cr copper alloy for electronic materials, containing about 0.5-about 2.5% by weight of Ni, about 0.5-about 2.5% by weight of Co, about 0.30-about 1.2% by weight of Si, and about 0.09-about 0.5% by weight of Cr, and the balance being Cu and unavoidable impurities, wherein the ratio of the total weight of Ni and Co to the weight of Si ([Ni+Co]/Si ratio) in the alloy composition satisfies the formula: about $4 \leq [Ni+Co]/Si \leq$ about 5, and the ratio of Ni to Co (Ni/Co ratio) in the alloy composition satisfies the formula: about $0.5 \leq Ni/Co \leq$ about 2, and wherein Pc is equal to or less than about 15/1000 μm², or Pc/P is equal to or less than about 0.3 wherein P is the number of inclusions dispersed in the alloy and having the size of 1 μm or more, and Pc is the number of inclusions, among those having the size of 1 μm or more, whose carbon concentration is 10% or more by weight.

In another aspect, the invention is (2) the Cu—Ni—Si—Co—Cr copper alloy for electronic materials stated in item (1), further comprising in total about 0.001-about 2.0% by weight of one or more elements selected from the group consisting of P, As, Sb, Be, B, Mn, Mg, Sn, Ti, Zr, Al, Fe, Zn and Ag.

In a further aspect, the invention is (3) a method for manufacturing Cu—Ni—Si—Co—Cr copper alloys for electronic materials stated in item (1) or (2), comprising the step of: heating an ingot for about 1 hour or more at a temperature from about 900° C. or more to less than about 1000° C. before hot rolling at a temperature of about 650° C. or more; and cold rolling before conducting solution treatment for about 5-about 3600 seconds at about 850-about 1000° C. and conducting age hardening for about 1-10 hours at about 350-about 550° C.

In a further aspect, the invention is (4) an electronic component using the Cu—Ni—Si—Co—Cr copper alloy for electronic materials stated in item (1) or (2).

Advantageous Effect of the Invention

The invention provides Cu—Ni—Si—Co—Cr alloys for electronic materials having dramatically improved electrical conductivity without decreasing strength.

BEST MODE FOR CARRYING OUT THE INVENTION (1) Addition Amount of Ni, Co and Si Ni, Co and Si form an intermetallic compound with appropriate heat-treatment, and make it possible to increase strength without adversely affecting electrical conductivity. Respective addition amount of Ni, Co and Si is explained hereinafter.

With regard to Ni and Co, addition amount should be Ni: about 0.5-about 2.5 wt % and Co: about 0.5-about 2.5 wt % to achieve the target strength and electrical conductivity. It is preferably Ni: about 1.0-about 2.0 wt % and Co: about 1.0-about 2.0 wt %, and more preferably Ni: about 1.2-about 1.8 wt % and Co: about 1.2-about 1.8 wt %. On the contrary, Ni: less than about 0.5 wt % or Co: less than about 0.5 wt % doesn't achieve the desired strength. Ni: more than about 2.5 wt % or Co: more than about 2.5 wt % significantly decreases electrical conductivity and impairs hot workability although it increases strength.

With regard to Si, addition amount should be about 0.30-about 1.2 wt % to achieve the target strength and electrical conductivity, and preferably, about 0.5-about 0.8 wt %. On the contrary, Si: less than about 0.3 wt % doesn't achieve the desired strength, and Si: more than about 1.2 wt % significantly decreases electrical conductivity and impairs hot workability although it increases strength.

(2) [Ni+Co]/Si Ratio

The invention defines the mass concentration ratio of the total weight of Ni and Co to the weight of Si ([Ni+Co]/Si).

The invention defines Ni/Si ratio within a narrow range at the lower side of conventional range of about $3 \leq$ Ni/Si $\leq$ about 7, namely adds a little more Si to make Co and Ni into silicide form and to leave no excessive solid solution of Ni and Co, which doesn't contribute to the precipitation, thereby enabling to prevent the decrease of electrical conductivity. However, if the mass concentration ratio is in the range of [Ni+Co]/Si<about 4, Si rate becomes so high that electrical conductivity decreases due to solid solution of Si. In addition, since a $SiO_2$ oxide film is formed on the material surface during annealing process, solderability deteriorates. Further, since Ni—Co—Si precipitation particles have a tendency to become coarse particles, which not only make no contribution to strengthening but also to become a possible cause of fractures during bending process and cause plating defects. On the other hand, if the ratio of Ni and Co to Si becomes higher and is in the range of [Ni+Co]/Si>about 5, electrical conductivity decreases significantly, and the alloy becomes undesirable for electronic materials.

Accordingly, the invention adjusts the [Ni+Co]/Si ratio within the range of about $4 \leq$ [Ni+Co]/Si $\leq$ about 5.

Preferably, the [Ni+Co]/Si ratio is in the range of about $4.2 \leq$ [Ni+Co]/Si $\leq$ about 4.7.

(3) Ni/Co Ratio

The invention also defines the mass concentration ratio of Ni to Co (Ni/Co ratio). It is believed that Ni and Co not only contribute to compound formation with Si, but also improve the characteristics of alloy by their mutual relation. The improvement of strength becomes prominent when Ni/Co ratio is in the range of about $0.5 \leq$ Ni/Co $\leq$ about 2. Preferably, the ratio is in the range of about $0.8 \leq$ Ni/Co $\leq$ about 1.3. On the contrary, if the mass concentration ratio is in the range of Ni/Co<about 0.5, electrical conductivity decreases although it increases strength. In addition, such ratio causes segregation at solidification. On the other hand, if Ni/Co ratio is undesirably higher than about 2, Ni concentration becomes too high and electrical conductivity decreases.

(4) Addition Amount of Cr

In accordance with the invention, the addition of about 0.09-about 0.5 wt % of Cr further improves age hardening characteristic. Preferably, the amount is in the range of about 0.1-about 0.3 wt %. Therefore, the addition of Cr is indispensable. Cr precipitates as Cr by itself or as compounds with Si within copper matrix, allowing the increase of electrical conductivity without adversely affecting strength. However, when the amount is lower than about 0.09 wt %, the effect becomes too small. On the other hand, when the amount is larger than about 0.5 wt %, the precipitates become coarse inclusions, which do not contribute to the increase of strength, resulting in deterioration of bending workability and plating characteristic.

(5) Other Additive Elements

The addition of P, As, Sb, Be, B, Mn, Mg, Sn, Ti, Zr, Al, Fe, Zn or Ag exhibits a variety of effects. These elements complement mutually and improve not only strength and electrical conductivity but also bending workability, plating characteristic, and productivities such as hot workability due to the miniaturization of cast structure. Therefore, one or more of these elements may be added to the aforementioned Cu—Ni—Si alloys containing Co and Cr depending on desired characteristics. In such case, the total amount should be equal to or less than about 2.0 wt %. Preferably, it is in the range of about 0.001-about 2.0 wt %, and more preferably, it is in the range of about 0.01-about 1.0 wt %. On the contrary, if the total amount is less than about 0.001 wt %, the desired strength cannot be achieved, and if it is more than about 2.0 wt %, electrical conductivity and productivity decrease significantly.

(6) Inclusion

As described above, Cr is added to precipitate as Cr by itself or as compounds with Si within copper matrix, allowing the increase of electrical conductivity without adversely affecting strength.

However, Cr has a tendency to form carbides. For example, if carbon particles are mixed into the melt from charcoal used as crucible material during melting and casting, or used as covering flux to prevent oxidation of the melt during atmospheric melting, they react with Cr and form carbides, and generate inclusions having high carbon content. In such case, Cr does not increase electrical conductivity in spite that it is added in an attempt to do so. Instead, an increase in the rate of inclusions having high carbon content deteriorates strength and electrical conductivity. In addition, these inclusions, when coarsed, also deteriorate bending workability and plating characteristics.

Accordingly, in the present invention, we have focused on the number of inclusions having high carbon content within copper matrix.

Carbon reacts with Cr in the presence of Cr and forms Cr-carbides. Therefore, Cr may exist everywhere carbon exists. That is, if an inclusion contains carbon, Cr is also contained in the inclusion, thus it can be known that Cr has been taken into the inclusion.

Especially, an inclusion having high carbon concentration includes Cr. Therefore, if the alloy contains large amount of such inclusions, the advantageous effect of Cr will be diminished. Accordingly, the effect of Cr can be evaluated by examining inclusions.

The term "an inclusion having high carbon concentration" is defined to be an inclusion with analyzed carbon value equal to 10 wt % or more.

The reason for this definition is that when carbon concentration is less than 10%, no or few Cr is detected from the inclusion, and thereby, the inclusion does not substantially decrease strength and electrical conductivity. Further, it is also defined to be an inclusion having a size equal to 1 μm or more. This is because when the size is less than 1 μm, the amount of Cr contained in the inclusion is negligible. If the number of inclusions having a size of 1 μm or more and analytical carbon content of 10 wt % or more is equal to or less than about 15 per 1000 $\mu m^2$, the decrease of strength and electrical conductivity is not significant.

However, even in the case where the number of inclusions is small, if the inclusions are coarse, the amount of Cr contained in the inclusions is high since Cr is taken into the inclusions during the growth process. Therefore, a coarse inclusion contains a larger amount of Cr. In such case, the advantageous effect of Cr is diminished, even if the number is small. Accordingly, we have found out that the characteristics can be evaluated from the ratio of the number of inclusions having high carbon concentration to the number of all inclusions because all inclusions grow in size and the number of the inclusions itself becomes small in such case.

In other words, the ratio Pc/P should be about 0.3 or less wherein P is the number of inclusions dispersed in the material and having the size of 1 μm or more, and Pc is the number of inclusions, among those having the size of 1 μm or more, whose carbon concentration is 10% or more by weight. When the ratio Pc/P is larger than about 0.3, the rate of Cr in the inclusions having high carbon concentration is high since they are the grown inclusions, thereby affecting strength and electrical conductivity even if the number of the inclusions is small.

Incidentally, in this application the term "inclusion" includes various particles, which can be observed in matrix of alloys of the invention by SEM observation, such as: precipitates formed in a solid phase matrix by precipitation reaction, in cooling process after solidification during casting of Cu—Ni—Si alloys, cooling process after hot rolling, age hardening process; crystallizations formed, usually in coarsed size, by segregation in the solidification during casting processes; and impurities such as oxides and sulfides formed by chemical reaction in the melt during melting process. The term "inclusion size" means the diameter of the minimum circle enclosing an inclusion when measured under FE-AES observation. The term "number of inclusions (P)" means the number of inclusions equal to or more than 1 μm in size when actually counted at multiple places on the material surface with FE-AES observation after electrolytic grinding. The term "number of inclusions having carbon concentration of 10 wt % or more (Pc)" means the number of inclusions having analyzed carbon value equal to 10 wt % or more among the inclusions having size equal to or more than 1 μm. The analyzed carbon value is obtained by measuring Auger spectrum for each inclusion after sputtering with Ar+ to remove absorbed elements (C, O) from the surface layer, and converting the detected elements to weight percent as a semi-quantitative value by sensitivity coefficient method.

(7) Manufacturing Method

A copper alloy in accordance with the invention can be manufactured by a conventional manufacturing method of Cu—Ni—Si—Co—Cr alloys. However, it is necessary to decrease the number of inclusions dispersed in the material having the size of 1 μm or more and whose carbon concentration is 10 wt % or more, and to prevent the coarsening of such inclusions in order to make or render the number Pc equal to or less than about 15/1000 $\mu m^2$, and the ratio (Pc/P) equal to or less than about 0.3 wherein P is the number of inclusions dispersed in the material and having the size of 1 μm or more, and Pc is the number of inclusions, among those having the size of 1 μm or more, whose carbon concentration is 10% or more by weight. The number of inclusions having the size of 1 μm or more and whose carbon concentration is 10 wt % or more can be decreased by preventing the formation of Cr-carbides during melting and casting, because Cr-carbides are formed primarily during the melting and casting.

Since the amount of carbon dissolving into melted copper is very small, the Cr-carbide formation is primarily caused by carbon introduced from outside of the melt, or by the reaction with the carbon-containing structural components contacting with the melt. For example, if scrap raw materials loaded into the melt contain a large amount of lubricant, the lubricant decomposes, and carbon contained in the lubricant reacts with Cr. In addition, carbon may be used in components such as a nozzle in a melting and casting facility, and it may react with Cr when contacted with the melt. To prevent the intrusion of carbon, extensive care should be taken for the selections of raw materials, crucible, coating method of charcoal, and materials of components contacting with the melt.

The following processes should be used during the manufacturing to prevent the coarsening of inclusions formed in the melting process.

Among the aforementioned inclusions (P), coarsed crystallizations and precipitates composed of Ni—Si can be solved when heated for one hour or more at about 900° C. or higher during annealing for homogenization before hot rolling. If this temperature is about 1000° C. or higher, the crystallizations may be liquefied due to local segregation, and it causes serious fractures during hot rolling. Therefore, it is desirable that the heating is conducted for one hour or more at about 900° C. or higher and less than about 1000° C. before hot rolling, and the ending temperature of the hot rolling is about 650° C. or higher. The processes conducted after the hot rolling may be the same as those in typical manufacturing of Cu—Ni—Si copper alloys, and cold rolling and heat-treatment processes are repeated to produce a strip, foil or the like having desired thickness and characteristics. The heat-treatment may include solution treatment and age hardening. The solution treatment comprises heating for about 5-about 3600 seconds at about 850° C. or higher and less than about 1000° C. to solve the compounds of Ni, Co, Si, Cr or the like, which may form precipitates, within Cu matrix, and to recrystallize the Cu matrix at the same time. The hot rolling process may sometimes serve as the solution treatment.

The age hardening comprises heating for about one hour or more in the temperature range of about 350° C.-about 550° C. so that Ni, Co, Si, Cr and the like elements solved in the solid solution at the solution treatment is precipitated as fine particles. This age hardening increases strength and electrical conductivity. If the temperature during the age hardening is lower, longer heat-treatment can disperse fine precipitates, and if the temperature during the age hardening is higher, the heat-treatment should be shortened to prevent the coarsening of precipitates. The optimal conditions may be selected depending on the process capacity of facilities, and cold rolling may be conducted before and/or after the age hardening to achieve higher strength. Further, if cold rolling is conducted after the age hardening, stress relief annealing (low temperature annealing) may be conducted after the cold rolling.

Cu—Ni—Si—Co—Cr copper alloys in accordance with the invention can be used in electronic components which are required to satisfy both high-strength and high-electrical conductivity (or thermal conductivity), such as a lead frame, connector, pin, terminal, relay, switch, and foil for secondary battery.

EXAMPLES

Examples of the invention are explained hereinafter. However, these examples are shown for better understanding of the invention and its advantages, and the invention is not limited to the examples.

Examples of copper alloys in accordance with the invention contain different amounts of Ni, Co, Cr and Si, and also contain Mg, Sn, Zn, Ag and B as appropriate, as shown in Table 1. On the other hand, comparative examples of copper alloys are Cu—Ni—Si—Co—Cr alloys having parameters outside of the range of the invention.

Copper alloys having compositions shown in Table 1 were melted by a high-frequency melting furnace at 1100° C. or higher, and were cast into ingots having the thickness of 25 mm.

Incidentally, to examine the effect of carbon in the invention, the examples in accordance with the invention were manufactured using an alumina crucible. And Ar gas was used to cover the melt and to stir added elements. On the contrary, the comparative examples were manufactured using a carbon crucible, charcoal to cover the melt, and a carbon stick to stir added elements. Then, for the examples other than Comparative examples 23-25, after the ingots were heated to 900° C. or higher, they were hot-rolled to the thickness of 10 mm and cooled immediately. On the contrary, for Comparative examples 23-25, it was conducted at 800° C. After their surfaces were grinded to remove scales on the surfaces such that the resulting thickness became 9 mm, they were cold-rolled to the thickness of 0.3 mm. Next, for the examples other than Comparative examples 26-28, they underwent solution treatment for 5-3600 seconds at 850-1000° C. depending on the amounts of Ni and Co, then hardening was conducted by water cooling. For Comparative examples 26-28, it was conducted at 800° C. Then, they were cold-rolled to 0.15 mm. Finally, for the examples other than Comparative examples 29-31, they underwent age hardening for 1-24 hours at 350-550° C. in inert atmosphere depending on the amount of additives to obtain test pieces. For Comparative examples 29-31, it was conducted at 600° C.

Characteristic evaluation on strength and electric conductivity was performed for each of alloys manufactured in the illustrative method. Tensile testing in the direction parallel to the rolling direction was conducted to measure 0.2% yield strength (YS), and electrical conductivity (EC; % IACS) was measured by volume resistivity measurement using double bridge.

Bending workability was measured by bending under the condition that the ratio of thickness to bending radius of a test piece becomes 1. The surface of bending portion was observed with an optical microscope, and when no crack was found, the test piece was recognized as non-defective (good), and when any crack was found, it was recognized as defective (bad).

With regard to surface characteristic, solderability was measured. Solderability was measured using Menisco graph method. Each test piece was immersed to the depth of 2 mm into 60% Sn—Pb bach at 235±3° C. for 10 seconds, and solder wetting time, i.e., the time required to thoroughly wet the test piece was measured. In addition, as a preliminary treatment for the solderability evaluation, it was degreased by acetone, and pickled by immersing and stirring into 10 vol % sulfuric acid solution for 10 seconds, water-washed, dried, and applied flux by immersing into 25% rosin-ethanol solution for 5 seconds. The target value for good solder wetting time was 2 seconds or less. The measurements of "the number of inclusions (P)" and "the number of inclusions having carbon concentration of 10 wt % or more (Pc)" were obtained by electrolytically grinding the material surface, actually counting inclusions having a size equal to or more than 1 μm at 10 fields of view on the material surface with FE-AES observation wherein each field of view had 100 μm² in area, sputtering with Ar+ to remove absorbed elements (C, O) from the surface layer, measuring Auger spectrum for each inclusion, converting the detected elements to weight percent as a semi-quantitative value by sensitivity coefficient method, and counting inclusions having analytical carbon concentration of 10 wt % or more.

TABLE 1

| | | % by weight | | | | | | | | | YS | EC | | |
|---|---|---|---|---|---|---|---|---|---|---|---|---|---|---|
| | No. | Ni | Co | Si | Cr | Others | [Ni + Co]/Si | Ni/Co | P | Pc | Pc/P | (MPa) | (% IACS) | Bendability | Solderability |
| Examples | 1 | 0.7 | 0.7 | 0.3 | 0.2 | | 4.7 | 1.0 | 9 | 1 | 0.11 | 735 | 54 | good | 0.6 |
| of The | 2 | 0.7 | 1.0 | 0.4 | 0.2 | | 4.3 | 0.7 | 13 | 2 | 0.15 | 745 | 54 | good | 0.7 |
| Invention | 3 | 0.7 | 1.3 | 0.4 | 0.2 | | 4.7 | 0.5 | 11 | 1 | 0.09 | 755 | 52 | good | 0.7 |
| | 4 | 1.3 | 0.7 | 0.5 | 0.2 | | 4.3 | 1.9 | 22 | 4 | 0.18 | 795 | 50 | good | 0.9 |
| | 5 | 1.3 | 1.3 | 0.6 | 0.2 | | 4.3 | 1.0 | 23 | 5 | 0.22 | 810 | 50 | good | 1.0 |
| | 6 | 1.3 | 1.8 | 0.7 | 0.2 | | 4.8 | 0.7 | 20 | 3 | 0.15 | 830 | 49 | good | 1.0 |
| | 7 | 2.0 | 1.2 | 0.7 | 0.2 | | 4.4 | 1.7 | 35 | 6 | 0.17 | 825 | 50 | good | 1.2 |
| | 8 | 2.0 | 1.4 | 0.9 | 0.2 | | 4.0 | 1.4 | 28 | 7 | 0.25 | 845 | 49 | good | 1.2 |
| | 9 | 2.0 | 1.8 | 0.9 | 0.2 | | 4.3 | 1.1 | 35 | 7 | 0.20 | 855 | 47 | good | 1.3 |
| | 10 | 1.3 | 1.3 | 0.6 | 0.1 | | 4.3 | 1.0 | 23 | 5 | 0.22 | 810 | 50 | good | 1.0 |
| | 11 | 1.3 | 1.3 | 0.6 | 0.4 | | 4.3 | 1.0 | 26 | 6 | 0.23 | 820 | 49 | good | 1.0 |
| | 12 | 1.3 | 1.3 | 0.6 | 0.2 | 0.1Mg | 4.3 | 1.0 | 24 | 5 | 0.21 | 880 | 44 | good | 0.8 |

TABLE 1-continued

|  | No. | Ni | Co | Si | Cr | Others | [Ni + Co]/Si | Ni/Co | P | Pc | Pc/P | YS (MPa) | EC (% IACS) | Bendability | Solderability |
|---|---|---|---|---|---|---|---|---|---|---|---|---|---|---|---|
|  | 13 | 1.3 | 1.3 | 0.6 | 0.2 | 0.5Sn | 4.3 | 1.0 | 22 | 4 | 0.18 | 825 | 48 | good | 1.0 |
|  | 14 | 1.3 | 1.3 | 0.6 | 0.2 | 0.5Zn | 4.3 | 1.0 | 22 | 4 | 0.18 | 830 | 48 | good | 1.0 |
| Comparative | 15 | 0.7 | 0.7 | 0.3 | 0.2 |  | 4.7 | 1.0 | 15 | 6 | 0.40 | 675 | 52 | bad | 2.1 |
| Examples | 16 | 1.3 | 1.3 | 0.6 | 0.2 |  | 4.3 | 1.0 | 32 | 16 | 0.50 | 730 | 46 | bad | 3.0 |
|  | 17 | 2.0 | 1.8 | 0.9 | 0.2 |  | 4.3 | 1.1 | 78 | 22 | 0.28 | 770 | 43 | bad | 3.3 |
|  | 18 | 1.3 | 1.3 | 0.6 | 0.1 |  | 4.3 | 1.0 | 32 | 15 | 0.47 | 740 | 53 | bad | 3.0 |
|  | 19 | 1.3 | 1.3 | 0.6 | 0.4 |  | 4.3 | 1.0 | 35 | 17 | 0.49 | 740 | 51 | bad | 3.0 |
|  | 20 | 1.3 | 1.3 | 0.6 | 0.2 | 0.1Mg | 4.3 | 1.0 | 31 | 14 | 0.45 | 800 | 44 | bad | 2.8 |
|  | 21 | 1.3 | 1.3 | 0.6 | 0.2 | 0.5Sn | 4.3 | 1.0 | 30 | 10 | 0.33 | 750 | 41 | bad | 3.0 |
|  | 22 | 1.3 | 1.3 | 0.6 | 0.2 | 0.5Zn | 4.3 | 1.0 | 30 | 10 | 0.33 | 760 | 41 | bad | 3.0 |
|  | 23 | 0.7 | 0.7 | 0.3 | 0.2 |  | 4.7 | 1.0 | 13 | 5 | 0.38 | 680 | 52 | bad | 2.1 |
|  | 24 | 1.3 | 1.3 | 0.6 | 0.2 |  | 4.3 | 1.0 | 29 | 11 | 0.38 | 740 | 46 | bad | 2.8 |
|  | 25 | 2.0 | 1.8 | 0.9 | 0.2 |  | 4.3 | 1.1 | 43 | 14 | 0.33 | 770 | 43 | bad | 3.0 |
|  | 26 | 0.7 | 0.7 | 0.3 | 0.2 |  | 4.7 | 1.0 | 12 | 4 | 0.34 | 685 | 52 | bad | 2.1 |
|  | 27 | 1.3 | 1.3 | 0.6 | 0.2 |  | 4.3 | 1.0 | 24 | 10 | 0.42 | 750 | 47 | bad | 2.6 |
|  | 28 | 2.0 | 1.8 | 0.9 | 0.2 |  | 4.3 | 1.1 | 41 | 14 | 0.34 | 775 | 43 | bad | 2.8 |
|  | 29 | 0.7 | 0.7 | 0.3 | 0.2 |  | 4.7 | 1.0 | 7 | 4 | 0.57 | 660 | 57 | bad | 2.1 |
|  | 30 | 1.3 | 1.3 | 0.6 | 0.2 |  | 4.3 | 1.0 | 14 | 7 | 0.50 | 710 | 54 | bad | 2.3 |
|  | 31 | 2.0 | 1.8 | 0.9 | 0.2 |  | 4.3 | 1.1 | 28 | 11 | 0.39 | 735 | 49 | bad | 2.8 |

With reference to Table 1, the result of characteristic evaluation was explained hereinafter.

For Examples 1-14 in accordance with the invention, they had excellent strength, electrical conductivity, bending workability, and solderability.

For Comparative examples 15-22, all of them had lower strength and electrical conductivity than the examples of the invention having the same alloy composition (e.g., Comparative example 15 vs. Example 1, Comparative example 16 vs. Example 5, and Comparative example 17 vs. Example 9). This is because Pc was larger than 15, or Pc/P was larger than 0.3 for all of Comparative examples 15-22.

For Comparative examples 23-31, although Pc was less than 15, Pc/P was larger than 0.3 for all of them.

For Comparative examples 23-25, since the temperature during annealing for homogenization before hot rolling was lower (800° C.), coarsed inclusions formed during melting and casting were not solved into Cu matrix completely, and some of the coarsed inclusions were remained. Therefore, although the number of inclusions was small, each of the comparative examples had degraded strength, electrical conductivity, bending workability, and solderability in comparison with the examples of the invention having the same alloy composition (Nos. 1, 5 and 9) since Pc/P was larger than 0.3.

For Comparative examples 26-28, although the number of coarsed inclusions formed during melting and casting were reduced in size during annealing for homogenization before hot rolling, they were not solved into Cu matrix satisfactory and there were relatively coarse inclusions since the temperature during solution treatment was 800° C. Therefore, the number of all inclusions was small, and Pc/P was larger than 0.3. Further, for Comparative examples 29-31, although hot rolling and solution treatment were conducted under the same conditions as examples of the invention, the rate of inclusions having a size equal to or more than 1 μm was raised due to over aging since the condition of age hardening was 600° C.-15 hours. In addition, since inclusions were coarsed and the number of all inclusions was decreased, Pc/P was larger than 0.3. Therefore, each of the comparative examples had degraded strength, electrical conductivity, bending workability, and solderability in comparison with the examples of the invention having the same alloy composition (Nos. 1, 5 and 9) since Pc/P was larger than 0.3.

Accordingly, we confirmed that the characteristics of an alloy improve dramatically by adjusting the composition of a Cu—Ni—Si—Co—Cr alloy within the range defined by the invention.

Those skilled in the art can readily come up with many variations from the disclosure of the present invention without departing from the essential feature and intent of the invention. Therefore, the invention should not be limited to these embodiments and such variations and other embodiments are also included in the present invention as defined by the appended claims.

What is claimed is:

1. A Cu—Ni—Si—Co—Cr copper alloy for electronic materials, containing about 0.5-about 2.5% by weight of Ni, about 0.5-about 2.5% by weight of Co, about 0.30-about 1.2% by weight of Si, and about 0.09-about 0.5% by weight of Cr, and the balance being Cu and unavoidable impurities, including carbon, wherein the ratio of the total weight of Ni and Co to the weight of Si ([Ni+Co]/Si ratio) in the alloy composition satisfies the formula: about 4≦[Ni+Co]/Si≦about 5, and the ratio of Ni to Co (Ni/Co ratio) in the alloy composition satisfies the formula: about 0.5≦Ni/Co≦about 2, and wherein Pc is about 1/1000 μm² to about 7/1000 μm², and Pc/P is about 0.09 to about 0.25 wherein P is the number of inclusions dispersed in the alloy and having the size of 1 μm or more, and Pc is the number of inclusions, among those having the size of 1 μm or more, whose carbon concentration is 10% or more by weight.

2. The Cu—Ni—Si—Co—Cr copper alloy for electronic materials of claim 1, further comprising in total equal to or less than about 2.0% by weight of one or more elements selected from the group consisting of P, As, Sb, Be, B, Mn, Mg, Sn, Ti, Zr, Al, Fe, Zn and Ag.

3. A method for manufacturing Cu—Ni—Si—Co—Cr copper alloys for electronic materials of claim 1 or 2, comprising the step of: heating an ingot at a temperature from about 900° C. or more to less than about 1000° C. before hot rolling at a temperature of about 650° C. or more; and cold rolling before conducting solution treatment at about 850-about 1000° C. and conducting age hardening at about 350-about 550° C., whereby said Cu—Ni—Si—Co—Cr copper alloy is produced.

4. An electronic component comprising the Cu—Ni—Si—Co—Cr copper alloy of claim 1 or 2.

* * * * *